(12) United States Patent
Aoki et al.

(10) Patent No.: US 6,678,480 B1
(45) Date of Patent: Jan. 13, 2004

(54) OPTICAL TRANSMITTER AND OPTICAL COMMUNICATION SYSTEM

(75) Inventors: Masahiro Aoki, Kokubunji (JP); Katsuhiko Kuboki, Komoro (JP)

(73) Assignee: Hitachi, Ltd., Tokyo (JP)

( * ) Notice: Subject to any disclaimer, the term of this patent is extended or adjusted under 35 U.S.C. 154(b) by 603 days.

(21) Appl. No.: 09/635,199

(22) Filed: Aug. 9, 2000

(30) Foreign Application Priority Data

Aug. 10, 1999  (JP) ............................................ 11-225894

(51) Int. Cl.[7] ............................................... H04B 10/04
(52) U.S. Cl. ........................ 398/195; 398/183; 398/185
(58) Field of Search ................................. 398/183, 185, 398/195, 196, 197, 200, 201

(56) References Cited

U.S. PATENT DOCUMENTS

| | | | | |
|---|---|---|---|---|
| 5,691,989 A | * | 11/1997 | Rakuljic et al. | 372/20 |
| 6,049,642 A | * | 4/2000 | Nakamura et al. | 385/16 |
| 6,233,263 B1 | * | 5/2001 | Chang-Hasnain et al. | 372/32 |
| 6,321,003 B1 | * | 11/2001 | Kner et al. | 385/24 |
| 6,323,990 B1 | * | 11/2001 | Yamamoto et al. | 359/328 |
| 6,370,169 B1 | * | 4/2002 | Imajuku et al. | 372/32 |

OTHER PUBLICATIONS

Sakano et al., "Tunable DFB Laser with a Striped Thin–Film Heater", *IEEE Photonics Technology Letters*, vol. 4 No. 4, Apr. 1992, pp. 321–323.

* cited by examiner

*Primary Examiner*—Jason Chan
*Assistant Examiner*—Dzung Tran
(74) *Attorney, Agent, or Firm*—Miles & Stockbridge P.C.

(57) ABSTRACT

With the use of a wavelength multiplex light source capable of being adapted to a wavelength standard channel by an easy method, wavelength multiplex optical communication equipment is realized at a low cost and with excellent repeatability in performance. In a preferred implementation, a part of output light of a tunable light source 101 is guided to a wavelength stabilizer device where the difference thereof from a predetermined wavelength is detected with the use of photodetectors and a processor and fed back to the light source via controllers. Specifically, a controller 108 supplies a widely-variable output to an upper electrode of a heater-integrated tunable laser, which is formed by mounting a thin film heater just above the upper electrode of a distributed feedback (DFB) semiconductor laser that excels in wavelength controllability. The controller and compensates for the variance of the wavelength of the output light from the predetermined frequency using the output of the processor. An optical transmitter suitable for high-density wavelength multiplex optical communications can be realized.

6 Claims, 7 Drawing Sheets

OPTICAL TRANSMITTER AND OPTICAL COMMUNICATION SYSTEM

FIELD OF THE INVENTION

The present invention relates generally to an optical transmitter, and more specifically relates to an optical transmitter to be applied to a wavelength multiplex (wavelength division multiplex) communication system with the use of a plurality of lightwave signals each having different wavelength.

BACKGROUND OF THE INVENTION

Wavelength multiplex optical communications where a plurality of light signals each having different wavelength are transmitted in a light transmitting line is important to achieve even higher performance and a lower cost in the communications field and the optical information processing field.

In wavelength multiplex optical communications, it is essential to stabilize and maintain wavelengths of light sources for a plurality of channels to predetermined values. Presently, the wavelengths or frequencies of channels that are to be used in the wavelength multiplex optical communications are fixed to specified values with a 50 or 100 GHz spacing (approximately 0.4 or 0.8 nm spacing) in detail through international standardization by the International Telecommunication Union (ITU). Therefore, it is one of the major problems how to tune the wavelength of a semiconductor laser serving as a light source and stabilize it in conformity to the standard values (ITU grids). Conventionally, in wavelength multiplex optical communication equipment that requires a high degree of reliability, a wavelength monitor and a feed back circuit are provided for each channel to achieve the stabilization of the wavelength of the light source and also a standby light source is provided for each channel in case of failure. Moreover, it is necessary to fabricate distributed feedback (DFB) lasers serving as individual light sources so that their wavelengths locate exactly in predetermined narrow wavelength regions. For this reason, there remains a large problem in the production yield of the semiconductor lasers. These problems are great hindrance against the miniaturization and cost reduction of a transmitter and will become increasingly significant with the decrease of wavelength channel spacing and the increase of the number of the channels.

A light source has been studied that uses a tunable semiconductor laser diode as a light source and is capable of tuning its wavelength over a desired wavelength band covering a plurality of channels. However, in this case, a wavelength stabilization technique for fixing the wavelength of a laser on the ITU grids is required in addition to the realization of a tunable semiconductor laser whose wavelength can be continuously scanned efficiently and easily. To answer this requirement, a tunable/wavelength-stabilized light source has been proposed which incorporates a wavelength tuning mechanism based on the thermo-electric cooler (Peltier) and a thin film etalon filter, which has, however, a problem that its construction and production are complicated as well as a problem of large power consumption. By the way, for this kind of a light source for the wavelength multiplex communication, a paper in IEEE Photonics Technology Letters, Vol.4, p.321 (1992) can be given as an example.

Presently, in optical communication systems for long-distance trunk lines, signal transmission speeds of 2.5 to 10 Gb/s are principally in use, and hence an external modulation method is essential. Therefore, a modulator-integrated light source is preferable that is formed by monolithically integrating a semiconductor laser and an external light modulator.

Therefore, it is a main object of the present invention to provide a light transmitter for wavelength multiplex optical communications that is easy to fabricate and capable of tuning its wavelength to the above-mentioned standard channels. Specifically, an object is to provide an optical transmitter suitable for long-distance optical communication with the use of a semiconductor laser with the external modulator monolithically integrated.

SUMMARY OF THE INVENTION

To achieve the above-mentioned object, an optical transmitter according to the present invention can be constructed to comprise: a semiconductor laser for emitting light having a single mode wavelength, a control circuit for tuning the above-mentioned wavelength in a wide range of wavelengths and stabilizing it to a specific wavelength, and optical means for performing optical/electrical conversion of the above-mentioned laser light to a current and providing it to the above-mentioned control circuit.

In a preferred embodiment of the present invention, the above-mentioned semiconductor laser and the above-mentioned optical means are monolithically integrated or hybrid integrated on a substrate. Moreover, the above-mentioned semiconductor laser is constructed in a heater-integrated tunable structure wherein a thin film heater is mounted just above an upper electrode of the distributed feedback (DFB) semiconductor laser or a distributed reflection (DBR) semiconductor laser which have excellent wavelength tunability. Moreover, the above-mentioned optical means is composed of an optical device having a plurality of single-peaked frequency characteristics at a plurality of discrete frequencies, the peaks being similar to one another, and the above-mentioned control circuit comprises a wavelength control circuit for tuning the above-mentioned single mode wavelength and an injection current control circuit for controlling the injection current of the above-mentioned semiconductor laser and constructed so that a difference and a summation of the signal components of adjacent frequencies of the above-mentioned discrete frequencies are fed to input sections of the above-mentioned wavelength control circuit and the above-mentioned injection current control circuit, respectively.

BRIEF DESCRIPTION OF THE DRAWINGS

Other objects, features and advantages of the invention will become apparent during the following discussion of the accompanying drawings, wherein:

FIG. 3 (FIGS. 3A and 3B) shows characteristic diagrams of the photodetector array 105 and the processor 107 of FIG. 1;

FIG. 9 (FIGS. 9A and 9B) shows characteristic diagrams of the embodiment of FIG. 8;

DETAILED DESCRIPTION OF THE PREFERRED EMBODIMENTS

First Embodiment

Figure 1:
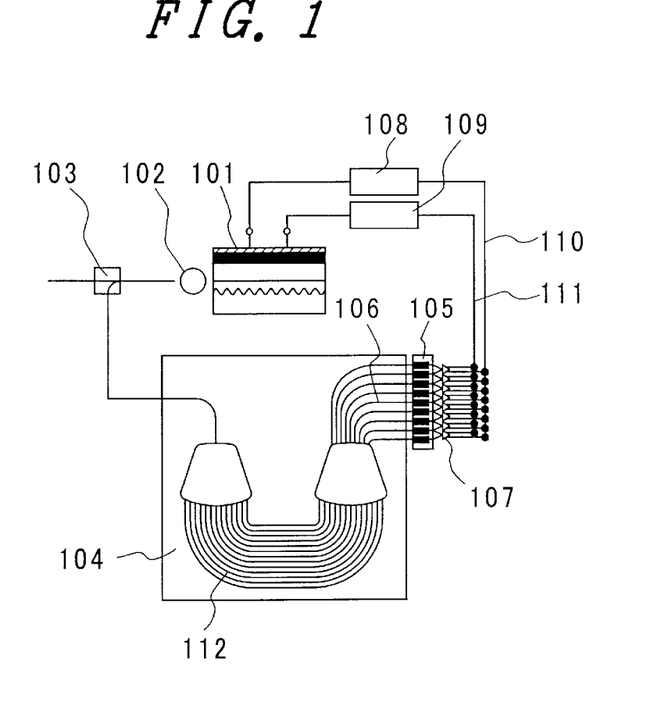
FIG. 1 is a view showing a construction of one embodiment of a light source part that constitutes a portion of an optical transmitter according to the present invention.

FIG. 1 shows the construction of one embodiment of the light source part that constitutes a portion of an optical transmitter according to the present invention.

This embodiment comprises: a semiconductor laser 101 for emitting light having a single mode wavelength that is tunable; a control circuit (108, 109) for tuning the above-mentioned a single mode wavelength and stabilizing the single mode wavelength so tuned to a specific wavelength; optical means or an optical device (103, 104, 105) for performing optical/electrical conversion of the light of the semiconductor laser 101 to a current and providing it to the above-mentioned control circuit.

The output of the tunable semiconductor laser 101 is guided to an optical divider 103 via a light coupling part 102. From the optical divider 103, a part of the input light is transmitted to an external modulator (not shown in the figure) as necessary light. A part of the above-mentioned input light is also divided and transmitted through an array waveguide matrix filter 104, and the outputs of array waveguides 112 of the array waveguide matrix filter 104 are guided to respective output waveguides 106 of the array waveguide matrix filter 104 according to the wavelength of the above-mentioned input light. Guided waves that are guided by a output waveguides 106 undergo optical/ electrical conversion by the photodetector array 105 that provided so as to correspond to output ends of the respective output waveguides 106. The photo currents obtained through the optical/electrical conversion are transformed into two currents by a processor 107 (details will be described later referring to FIG. 3): one current is applied to a heating electrode provided in the vicinity of the upper electrode of the tunable semiconductor laser 101 that is a heater-integrated tunable laser 101 via a wavelength control circuit 108; and the other current is applied to an injection current electrode of the semiconductor laser 101 via a laser injection current control circuit 109.

Figure 2:
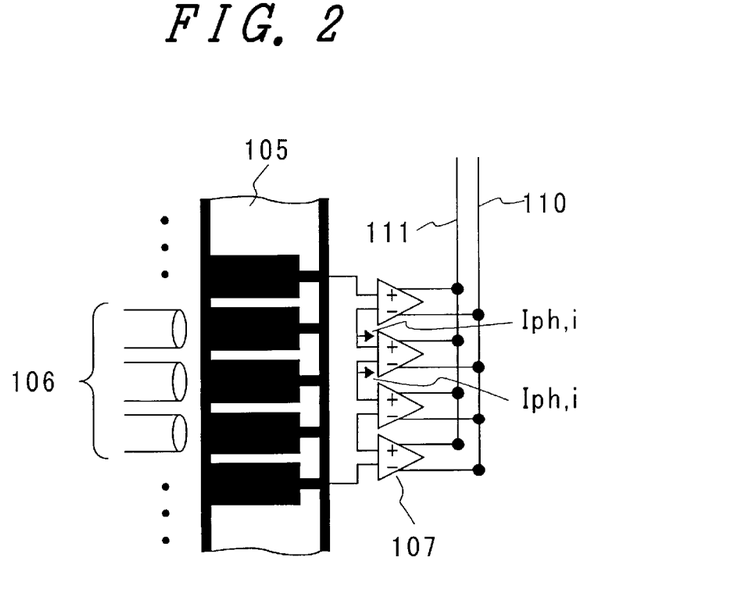
FIG. 2 is a circuit diagram showing details of a photodetector array 105 and a processor 107 of FIG. 1.

FIG. 2 is the circuit diagram showing the details of the photodetector array 105 and the processors 107 of FIG. 1. In the photodetector array 105, each of the adjacent photodetectors is given a serial number, like the (i)th element, the (i+1)th element, (i+2)th element, . . . Each of the processors 107 is composed of a differential amplifier which takes in the photo currents of the adjacent photodetectors as its two inputs. The summation output of each differential amplifier 107 is connected commonly to the line 111 which is inputted to the laser injection current control circuit 109; the difference output of each differential amplifier 107 is connected commonly to the line 110 which is inputted to the wavelength control circuit 108.

Figure 3A:
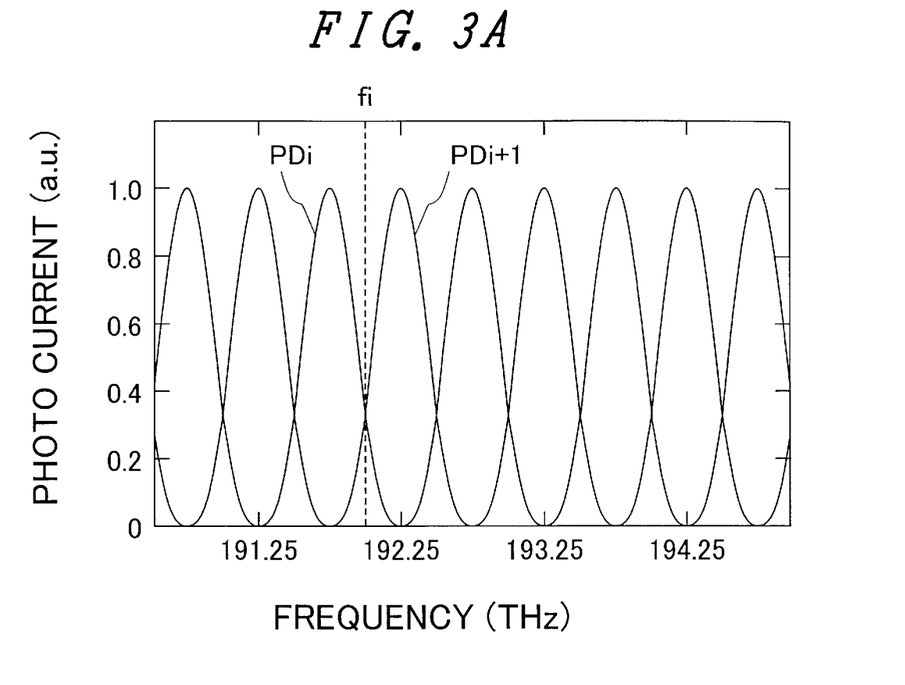
Figure 3B:
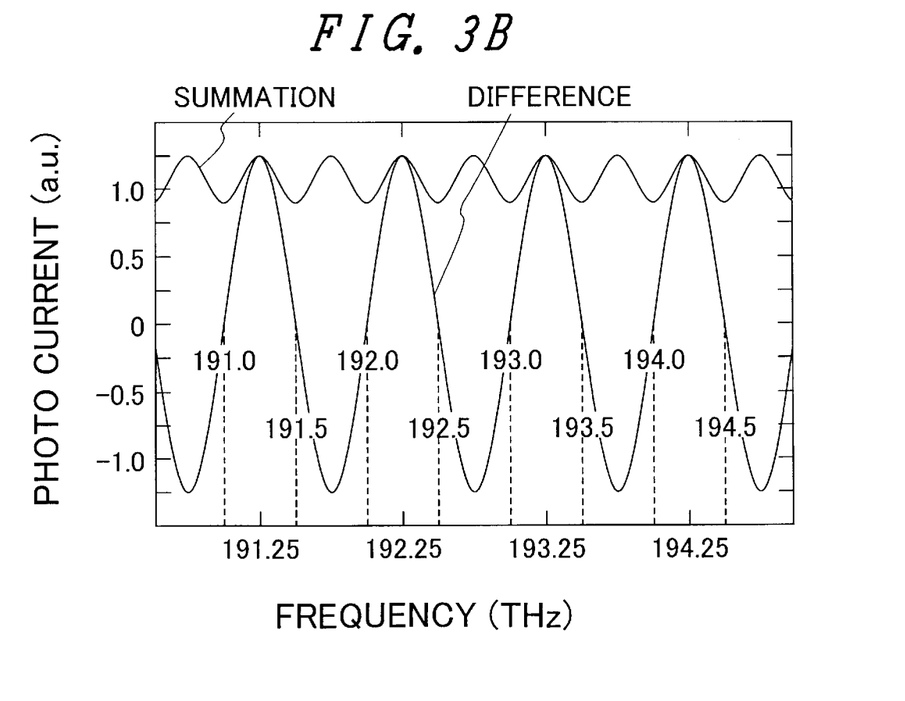

FIG. 3 shows characteristic diagrams of the photodetector array 105 part and the processors 107, where FIG. 3A shows the dependence of the amount of the photo current of the photodetector array 105 on the wavelength of the input light and FIG. 3B shows the dependence of the outputs (summation and difference) of the processors 107 on the wavelength of the input light.

The amount of the photo current of each photodetector 105 varies, as shown by the dependence on the wavelength of the input light of FIG. 3A, in response to the wavelength of the transmitted light of the array waveguide matrix filter 104. In this case, the spacing and the full width of the half maximum of the array waveguide matrix filter 104 are both set to 50 GHz. The general characteristic of the array waveguide matrix filter 104 and each photodetector 105 is one that consists of a plurality of single-peaked frequency characteristics which are centered at a plurality of discrete frequencies $f_i$, $f_{i+1}$, $f_{i+2}$, . . . and similar to one another.

Denoting the output currents of the (i)th and (i+1)th photodetectors among the photodetector array 105 as $I_{ph,i}$, $I_{ph,i+1}$, respectively, the summation component $(I_{ph,i}+I_{ph,i+1})$ and the difference component $(I_{ph,i}-I_{ph,i+1})$ of these currents are extracted using the corresponding operational amplifier 107.

As shown in FIG. 3B, the difference component $(I_{ph,i}-I_{ph,i+1})$ crosses the zero point (horizontal axis) at a frequency of $f_i$. Here, each discrete frequency $f_i$ (i=1, 2, . . . ) is arranged at a regular interval of approximately 50 GHz. The example shown in the figure is a case of $f_i=191.0\pm0.5i$ (THz). On the other hand, the summation component $(I_{ph,i}+I_{ph,i+1})$ becomes approximately a constant value. By a process where this difference component is inputted to the wavelength control circuit 108 via the line 110 and then fed back to the wavelength control current, the emission wavelength of the tunable laser 101 is stabilized to a predetermined wavelength value $\lambda_i$. That is, by providing the above-mentioned difference component to the previously-determined wavelength control current, the current to be supplied to the heating electrode of the laser 101 is controlled so that the photo current of FIG. 3B reduces to zero at the frequency $f_i$ corresponding to the emission wavelength $\lambda_i$ of the tunable laser 101. At the same time, by a process where the summation component is inputted to the laser injection current control circuit 109 via the line 111 and fed back to the injection current of the tunable laser 101, the optical output of the tunable laser 101 is controlled to a predetermined value.

The feature of this embodiment is to stabilize a plurality of wavelengths using one waveguide device (array waveguide matrix filter 104). Therefore, an especially significant feature is that the emission wavelength of the tunable light source is stabilized to a predetermined discrete wavelength.

In the foregoing, this embodiment is shown with the heater-integrated tunable laser. However, the present invention can also be applied for the wavelength stabilization in any tunable laser such that the wavelength thereof can be altered in a wide range of wavelength and the wavelengths concerned needs to be set to one of discrete frequencies in the above-mentioned wide range of wavelengths.

Second Embodiment

Figure 4:
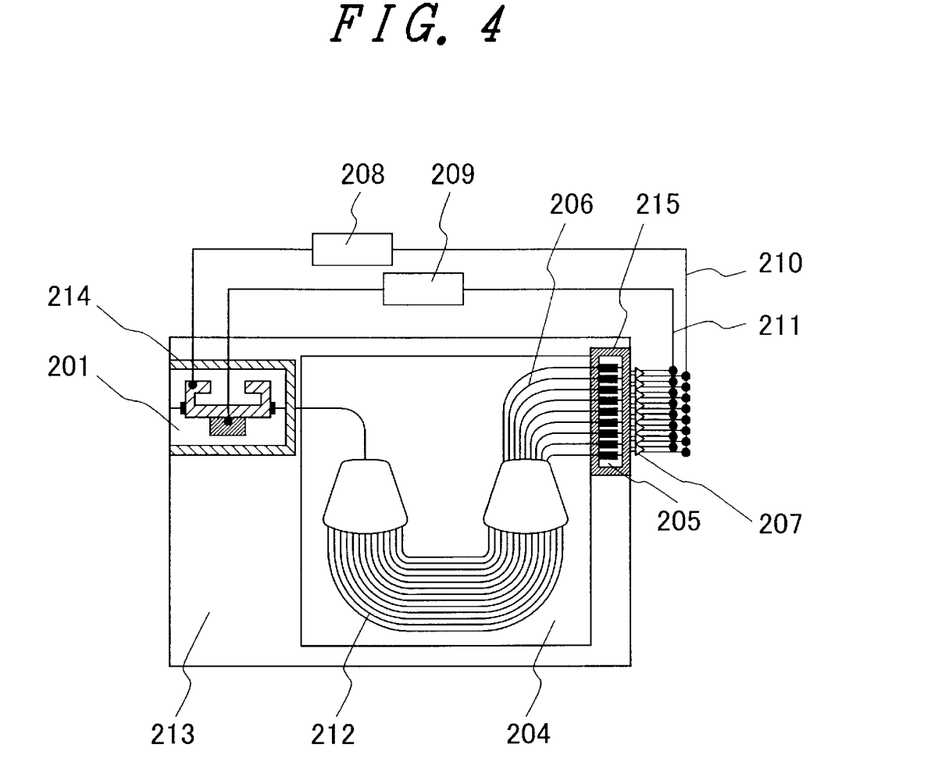
FIG. 4 is a view showing a construction of a second embodiment of the light source part that constitutes a portion of an optical transmitter according to the present invention.

FIG. 4 shows the construction of the second embodiment of the light source that constitutes a portion of an optical transmitter according to the present invention. This embodiment is one that is carried into practice by hybrid-integrating component parts shown in FIG. 1 on a substrate.

An array waveguide matrix filter 204 having composed of silica optical waveguides 212 is formed on a silicon substrate 213. On the silicon substrate 213, formed are a laser mounting part 214 on which the tunable distributed feedback (DFB) semiconductor laser 201 is to be integrated and a mounting part 215 on which a photodetector array 205 is to be integrated. By the way, component parts 201 to 211 of FIG. 4 correspond to the component parts 101 to 111 of FIG. 1, respectively.

Figure 5:
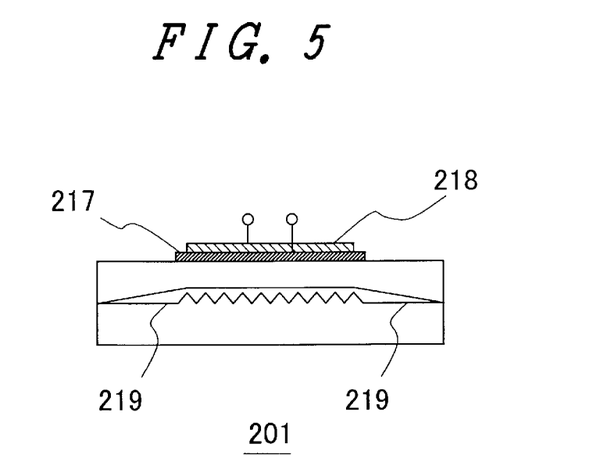
FIG. 5 is a sectional view of a semiconductor laser 201 of FIG. 4.

The semiconductor laser 201, as shown in the sectional view of FIG. 5, is a distributed feedback (DFB) semiconductor laser 201 having a multi-quantum well (MQW) active layer whose emission wavelength is approximately 1550 nm, wherein a platinum thin film heater 218 electrically insulated from the surface electrode 217 is formed just above the surface electrode 217 of the laser 201. With this structure, by sending an electric current to the platinum thin film heater 218, the laser active layer part is heated to effect the refractive index change. Thereby, the emission wavelength of the distributed feedback (DFB) laser 201 is altered. Moreover, beam expansion waveguides 219 are monolithically integrated at the front and rear facets of the distributed feedback (DFB) laser 201. The above-mentioned embodiment is a case where the platinum thin film heater 218 is provided just above the surface electrode 217. However, the platinum thin film heater 218 may be provided in the vicinity of the waveguide, namely being 1 to 30 $\mu$m from the waveguide, that constitutes a portion of the semiconductor laser.

Rearwardly emitted output light of the tunable distributed feedback (DFB) semiconductor laser 201 is transmitted through the array waveguides 212 and guided to output waveguides 206 of the array waveguide matrix fitter 204 according to the wavelength of the output light. These guided waves are converted into photo currents by the photodetector array 20S provided at the output ends of the output waveguides 206. Since the photo current changes according to the wavelength of the transmitted light of the array waveguide matrix filter, by extracting the difference component and the summation component of the photo currents of the adjacent photodetectors, as is the same as the first embodiment, and feeding each component to the heater current or the laser injection current via the wavelength control circuit 208 or the laser injection current control circuit 209, respectively, the optical output and the wavelength of the tunable laser 201 are stabilized to a predetermined output level and a predetermined wavelength value, respectively.

Third Embodiment

Figure 6:
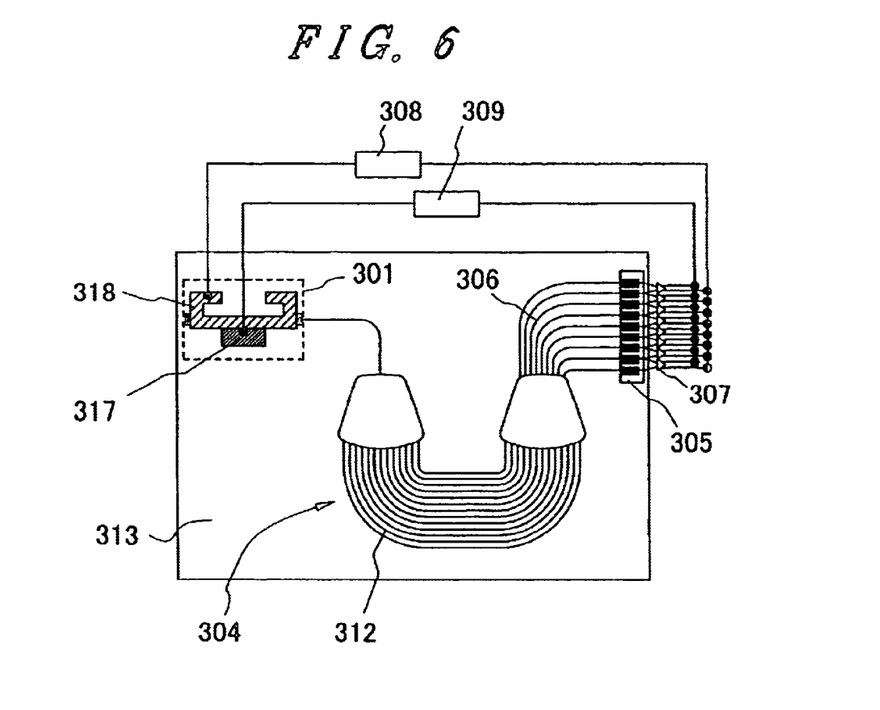
FIG. 6 is a view showing a construction of a third embodiment of the light source part that constitutes a portion of an optical transmitter according to the present invention.

FIG. 6 shows the construction of the third embodiment of the light source part that constitutes a portion of an optical transmitter according to the present invention. This embodiment is different from the first embodiment in a point that component parts (101, 105, 106, 112) of the first embodiment are monolithically integrated on a InP substrate 304, where component parts 301, 304, 305, 306, 308, 309, and 312 correspond to the component parts 101, 104, 105, 106, 108, 109, and 112, of FIG. 1, respectively, and each operation of those component parts is the same as that of first embodiment. Using the well-known technique, a thin film heater 318 that is electrically insulated from an element surface electrode 317 is formed just above the upper side of the surface electrode 317 of the distributed feedback (DFB) semiconductor laser 301 having a multi-quantum well (MQW) active layer whose emission wavelength is approximately 1550 nm.

In this embodiment, by sending an electric current to the platinum thin film heater 318, the active layer part of the laser is heated to effect the refractive index change, and consequently the emission wavelength of the distributed feedback (DFB) laser 301 is made to alter. At the back side of the distributed feedback (DFB) semiconductor laser 301, the waveguide array 312 composed of InGaAsP waveguides is monolithically integrated. The array 304 is constructed with InGaAsP whose compositional wavelength is 1.15 $\mu$m and formed into a high-mesa structure. At the output side of the array waveguide matrix filter 312, a waveguide photodetector array 305 is monolithically integrated.

Also in this embodiment, like the first and second embodiments, the difference component and the summation component of the photo currents of the adjacent photodetectors are extracted and fed back to the heater current and the laser injection current, respectively, so that the optical output and the wavelength of the tunable laser are stabilized to the predetermined level and the predetermined wavelength value, respectively. Moreover, a further feature of this embodiment is a point that by controlling the temperature of the monolithic integrated device, the stabilized wavelength can easily be set in conformity to the wavelengths of the international standard values (ITU). This feature originates in the temperature coefficient of the operating wavelength of the semiconductor waveguide as large as +0.1 nm/deg (–12 GHz/deg).

Fourth Embodiment

Figure 7:
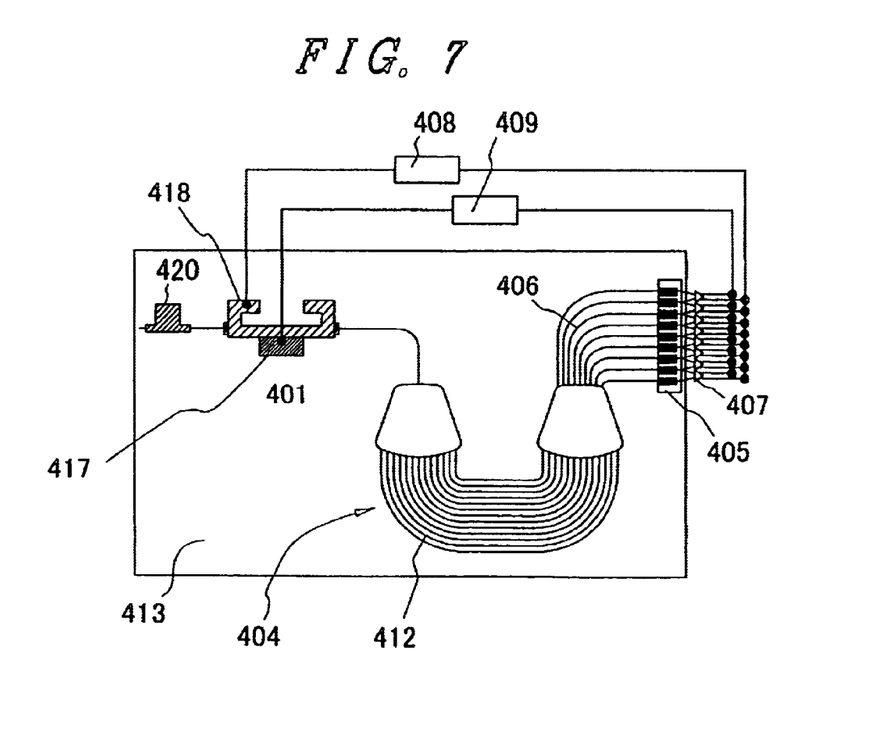
FIG. 7 is a view showing a construction of a fourth embodiment of the light source part that constitutes a portion of an optical transmitter according to the present invention.

FIG. 7 shows the construction of the fourth embodiment of the light source part that constitutes a portion of an optical transmitter according to the present invention. In this embodiment, an electroabsorption optical modulator 420 and an array waveguide matrix filter 404 are monolithically integrated with a distributed feedback (DFB) laser 401 of the same operating principle as that of the construction shown in the third embodiment. The distance between the semiconductor laser 401 and the electroabsorption modulator 420 is set to 150 $\mu$m or more and this setting makes possible a design wherein the heat applied to the inside of the laser when the wavelength is being altered doesn't reach the optical modulator 420. By the way, component parts 401, 404, 405, 406, 407, 408, 409, 412, 413, 417, and 418 correspond to the component parts 301, 304, 305, 306, 307, 308, 309, 312, 313, 317, and 318 of FIG. 3, respectively.

Also in this embodiment, like the first to third embodiments, the difference component and the summation component of the photo currents of the adjacent photodetectors are extracted and fed back to the heater current and the laser injection current via the wavelength control circuit 408 and the laser injection current control circuit 409, respectively, so that the optical output and the wavelength of the tunable laser are stabilized to the predetermined level and the predetermined wavelength value, respectively. Moreover, this embodiment of such construction has realized stable long-distance communication characteristics at a 10 Gb/s transmission rate within a wavelength scanning range as much as 4 nm when the wavelength is altered. This achievement results from a fact that the change of a chirping characteristic of the electroabsorption modulator is insubstantial within a wavelength range of 4 nm or so.

Fifth Embodiment

Figure 8:
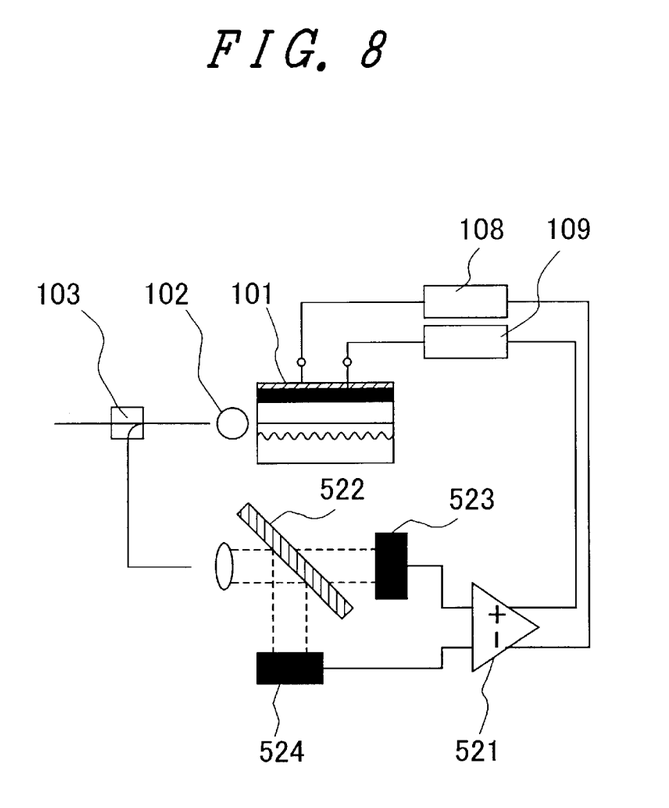
FIG. 8 is a view showing a fifth embodiment of the principal part of an optical transmitter according to the present invention.

FIG. 8 is a view showing the fifth embodiment of the principal part of an optical transmitter according to the present invention. This embodiment has a construction wherein the array waveguide matrix 112 of the wavelength filter part in the first embodiment is replaced with a Fabry-Perot etalon 522 composed of a dielectric multilayer filter. Each of other component parts having the same function as that of the component part of FIG. 1 is numbered with the same numeral of FIG. 1 and the description thereof will be omitted. The Fabry-Perot etalon 522 is disposed slantingly at 45° with respect to the incident light so as to generate transmitted light and reflection light. The transmitted light and the reflection light are converted into the photo currents by a photodetector 523 and a photodetector 524 each of which is provided separately, which is the same as that of the first embodiment. In this fifth embodiment, the Fabry-Perot etalon 522 is used as an optical filter. However, a bandpass filter having a plurality of transmission windows with the use of a dielectric multilayer may be used to attain a similar effect.

Figure 9A:
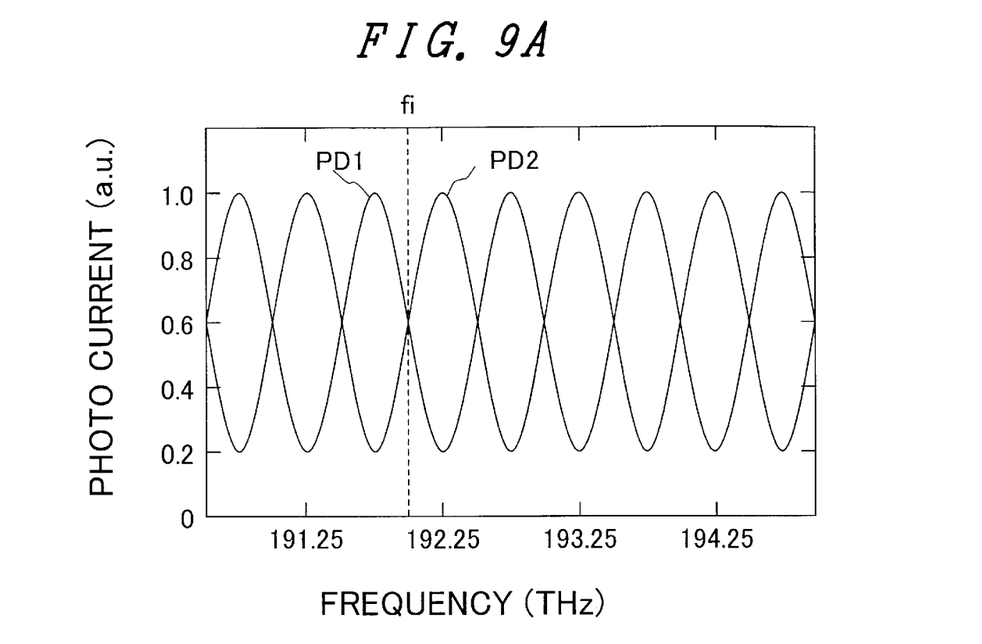
Figure 9B:
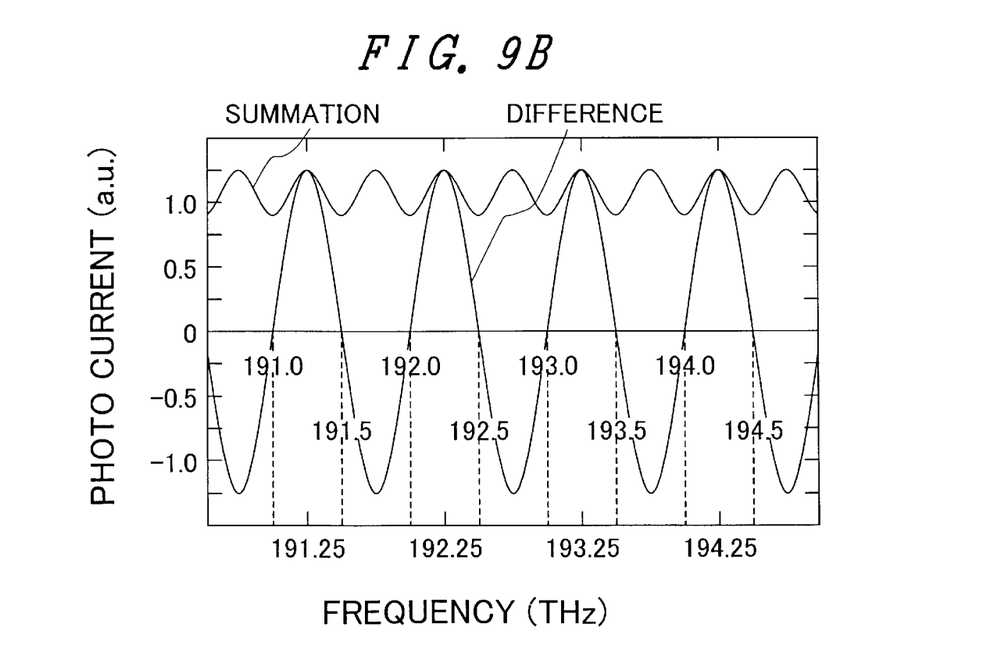

FIG. 9 shows characteristic diagrams of the photodetectors 523, 524 and the processor 521 of FIG. 8, where FIG. 9A shows the dependence of the photo current on the wavelength of the input light and FIG. 9B shows the dependence of the outputs on the wavelength of the input light. By extracting the difference component and the summation component of the photo currents of the photodetectors 523 and 524 and feeding these components to the heater current and the laser injection current, respectively, the optical output and the wavelength of the tunable laser 101 are stabilized to a predetermined output level and a predetermined wavelength value, respectively. These characteristics are substantially the same as those described in FIG. 3, so detailed description will be omitted.

Sixth Embodiment

Figure 10:
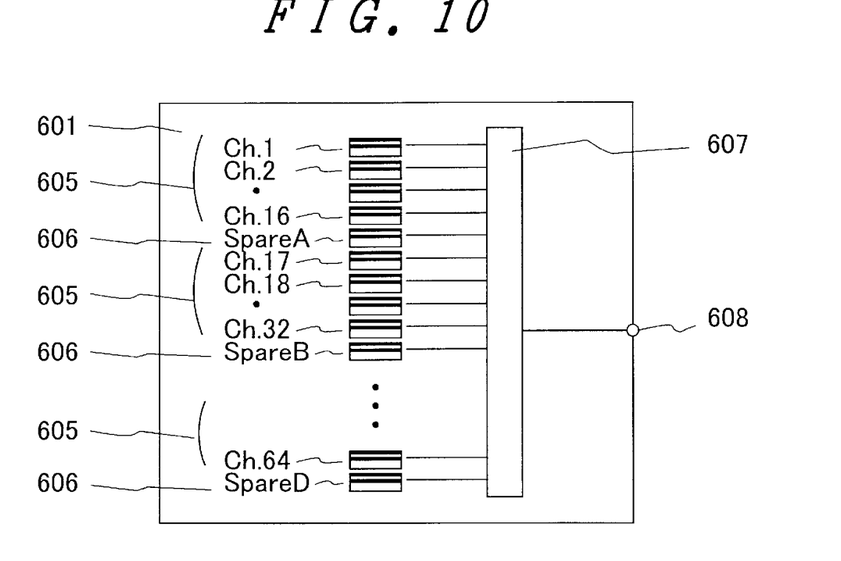
FIG. 10 is a view showing a construction of one embodiment of wavelength multiplex optical communication equipment in which the optical transmitters according to the present invention are incorporated.

FIG. 10 is a view showing the construction of one embodiment of wavelength multiplex optical communication equipment in which the optical transmitters according to the present invention are incorporated.

The wavelength multiplex optical communication equipment 601 has: sixty-four (64) optical transmitters 605 each of which emits light having a unique single mode frequency; four optical transmitters 606 of the fourth embodiment; a multiplexer 607 for multiplexing the output light of the above-mentioned optical transmitters 605 and 606; and an optical waveguide 608 for outputting the wavelength multiplexed light from the multiplexer 607 to the outside. Each of four standby transmitters spare A, B, C, D of the optical transmitters 606 has a tunable wavelength region covering each of four wavelength regions for four groups of the optical transmitters 605 consisting of sixteen (16) channels each ch.1, ch.2, . . . , ch.16; ch.17, ch.18, . . . , ch.32; ch.33, ch.34, . . . , ch.48; ch.49, ch.50, . . . , ch.64. The four optical transmitters 606 can cover the whole wavelength band ranging from 1532 to 1558 nm of all the channels ch.1, ch.2, . . . , ch.64. The wavelength spacing between the channels ch.1, ch.2, . . . , ch.64 is 50 GHz. That is, initially-set wavelengths are different by 6 nm. When a failure occurs in any of the sixty-four (64) light sources 605 originally set, the tunable single mode wavelength of the standby optical transmitter 606 corresponding to the channel group where the failure occurred is set to the wavelength of the failed channel, and hence the failed channel can be reestablished rapidly. In this construction, only four standby optical transmitters can serve as backup transmitters for the whole sixty-four (64) channels. By virtue of this feature, the transmitter can be greatly improved in its miniaturization and economization compared to a conventional construction where all the channels are equipped with respective spare parts.

Seventh Embodiment

FIG. 10 is a view showing the construction of one embodiment of a wavelength multiplex communication system in which the optical transmitters according to the present invention are installed.

Figure 11:
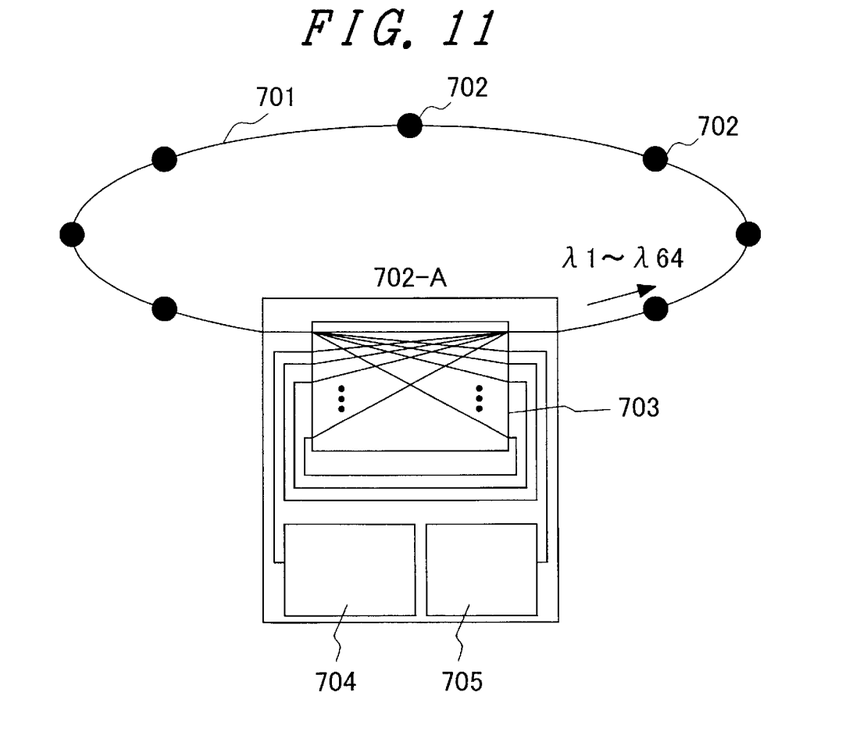
FIG. 11 is a view showing a configuration of one embodiment of a wavelength multiplex network in which the optical transmitters according to the present invention are installed.

A plurality of communication nodes 702 are connected to an optical transmission line 701 having loop topology that is normally composed of single mode fiber. The wavelengths of channels 64 channels total are used in the network range from 1532 to 1558 nm with a wavelength channel spacing of 50 GHz. Each communication node 702 is, as shown in the block 702-A, furnished with a wavelength selection type optical switch 703 for dropping each wavelength signal, and a transmitter 704 and a receiver 705 both of which are connected to the optical transmission line 701 via the optical switch 703.

The transmitter 704 is similar to the optical transmitters described in the description of each of the above-mentioned embodiments, that is, it has a light source whose wavelength is selected and stabilized and an external modulator for modulating the light from the light source in response to a signal that is to be transmitted. Moreover, a transmitter 704 has a construction that covers sixteen (16) channels among the above-mentioned total of (64) channels.

In this embodiment, a wavelength of a wavelength signal to be newly added at each node 702 can be tuned to and stabilized at a desired value assigned by ITU, which has been realized for the first time by the realization of the optical transmitter according to the present invention.

With the optical transmitter according to the present invention, highly reliable, high-quality wavelength multiplex optical communication equipment can be realized by an easy method. Further, therewith, the highly reliable optical transmitter specially featured in its capability of continuously tuning the wavelength of a transmitted signal and stabilizing the wavelength so tuned can be realized in a low cost and easily.

Although the invention has been described in its preferred form with a certain degree of particularity, it is understood that the present disclosure of the preferred form merely exemplary and that the details of construction and the combination and arrangement of parts may be changed without departing from the spirit and the scope of the invention as hereinafter claimed.

What is claimed is:
1. An optical transmitter comprising:
  a semiconductor laser that emits light having a single mode wavelength;
  an optical device that performs optical/electrical conversion of the light of the semiconductor laser into a photo current; and
  a control circuit that alters the single mode wavelength and stabilizes the single mode wavelength so altered to a specific wavelength based on the photo current;
  wherein the optical device comprises a filter having transmission windows for a plurality of frequency channels;

the control circuit comprises a wavelength control circuit that tunes the semiconductor laser emitting light having a single mode wavelength and an injection current control circuit that controls an injection current of the semiconductor laser; and a summation signal and a difference signal of signal components of adjacent frequency channels among the plurality of frequency channels of the filter are inputted to input sections of the injection current control circuit and the wavelength control circuit, respectively.

2. An optical transmitter according to claim 1, wherein the optical device comprises: a waveguide optical device; and photodetectors for performing optical/electrical conversion of outputs of the waveguide optical device.

3. An optical transmitter according to claim 2, wherein the waveguide optical device includes an array waveguide matrix having a plurality of optical waveguides each of which has a different transmitting wavelength.

4. An optical transmitter according to claim 3, wherein the semiconductor laser and the array waveguide matrix are hybrid integrated on a substrate.

5. An optical transmitter according to claim 3, wherein the semiconductor laser and the array waveguide matrix are monolithically integrated on a semiconductor substrate.

6. An optical transmitter according to claim 5, comprising an optical modulator that modulates output light of the semiconductor laser, wherein the semiconductor laser, the optical modulator, and the array waveguide matrix are monolithically integrated on a semiconductor substrate.

* * * * *